United States Patent
Ready

(10) Patent No.: US 9,892,863 B2
(45) Date of Patent: Feb. 13, 2018

(54) CHIP-SCALE EMBEDDED CARBON NANOTUBE ELECTROCHEMICAL DOUBLE LAYER SUPERCAPACITOR

(71) Applicant: GEORGIA TECH RESEARCH CORPORATION, Atlanta, GA (US)

(72) Inventor: William Jud Ready, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 15/313,883

(22) PCT Filed: May 24, 2015

(86) PCT No.: PCT/US2015/032329
§ 371 (c)(1),
(2) Date: Nov. 23, 2016

(87) PCT Pub. No.: WO2015/183762
PCT Pub. Date: Dec. 3, 2015

(65) Prior Publication Data
US 2017/0194100 A1    Jul. 6, 2017

Related U.S. Application Data

(60) Provisional application No. 62/002,812, filed on May 24, 2014, provisional application No. 62/156,977, filed on May 5, 2015.

(51) Int. Cl.
*H01G 9/00* (2006.01)
*H01G 11/36* (2013.01)
(Continued)

(52) U.S. Cl.
CPC ............ *H01G 9/155* (2013.01); *B32B 33/00* (2013.01); *B82Y 10/00* (2013.01); *B82Y 40/00* (2013.01);
(Continued)

(58) Field of Classification Search
CPC ......... H01L 28/88; H01L 28/92; H01L 49/02; H01R 4/58; H01G 11/36
See application file for complete search history.

(56) References Cited

U.S. PATENT DOCUMENTS

| 5,711,988 A | 1/1998 | Tsai et al. | |
| 2006/0158828 A1* | 7/2006 | Amey, Jr. | H05K 1/162 361/311 |

(Continued)

FOREIGN PATENT DOCUMENTS

| WO | 2008/016990 A2 | 2/2008 |
| WO | 2010/144153 A2 | 12/2010 |

OTHER PUBLICATIONS

International Search Report in related International Patent Application No. PCT/US2015/032329, dated Oct. 26, 2015.
(Continued)

*Primary Examiner* — Phuc Dang
(74) *Attorney, Agent, or Firm* — Troutman Sanders LLP; Ryan A. Schneider

(57) ABSTRACT

The disclosure provides for electrochemical supercapacitors with high energy densities, based on paired groups of carbon nanotube mounted to conductive substrates. In one variation, the electrochemical supercapacitors are double layer capacitors, or electrochemical double layer capacitors, containing opposing groups of carbon nanotubes on opposing substrates. In another variation, the capacitor is an interdigitated capacitor of alternating electrode containing carbon nanotubes, mounted on a common substrate. Processes and devices are also described.

18 Claims, 16 Drawing Sheets

(51) Int. Cl.

| | |
|---|---|
| *H01G 11/04* | (2013.01) |
| *H01G 11/46* | (2013.01) |
| *H01G 11/78* | (2013.01) |
| *H01G 11/84* | (2013.01) |
| *B32B 33/00* | (2006.01) |
| *H01L 21/02* | (2006.01) |
| *H01L 29/92* | (2006.01) |
| *H01M 4/38* | (2006.01) |
| *B82Y 10/00* | (2011.01) |
| *B82Y 40/00* | (2011.01) |
| *H01L 49/02* | (2006.01) |
| *H01L 29/06* | (2006.01) |

(52) U.S. Cl.
CPC ............ *H01G 11/04* (2013.01); *H01G 11/36* (2013.01); *H01G 11/46* (2013.01); *H01G 11/78* (2013.01); *H01G 11/84* (2013.01); *H01L 21/02527* (2013.01); *H01L 29/92* (2013.01); *H01M 4/386* (2013.01); *H01L 28/90* (2013.01); *H01L 29/0673* (2013.01); *Y02E 60/13* (2013.01)

(56) References Cited

U.S. PATENT DOCUMENTS

| | | |
|---|---|---|
| 2009/0059474 A1 | 3/2009 | Zhamu et al. |
| 2010/0035093 A1* | 2/2010 | Ruoff ............... H01G 11/36 429/493 |
| 2011/0053393 A1* | 3/2011 | Shigihara ............ H01R 4/58 439/91 |
| 2011/0205688 A1 | 8/2011 | Ray et al. |
| 2013/0055559 A1 | 3/2013 | Slocum et al. |
| 2014/0042390 A1 | 2/2014 | Gruner et al. |
| 2014/0139975 A1 | 5/2014 | Lowenthal et al. |

OTHER PUBLICATIONS

Written Opinion of the International Searching Authority in related International Patent Application No. PCT/US2015/032329, dated Oct. 26, 2015.

Ready, WJ. Application-Specific Research in Nanotechnology. Georgia Institute of Technology. Presentation. Feb. 28, 2012 [Retrieved on Aug. 10, 2015]. Retrieved from the Internet: <URL: http://smartech.gatech.edu/handle/1853/43163>.

* cited by examiner

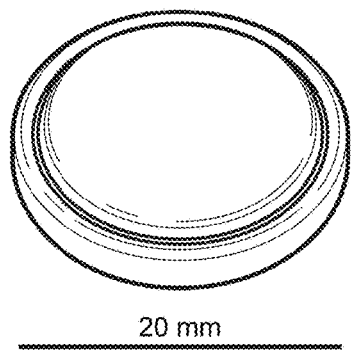
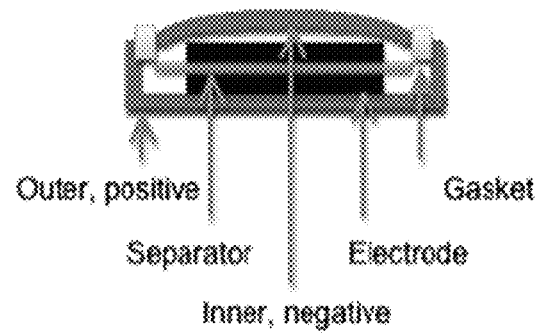
Figure 1A
Figure 1B
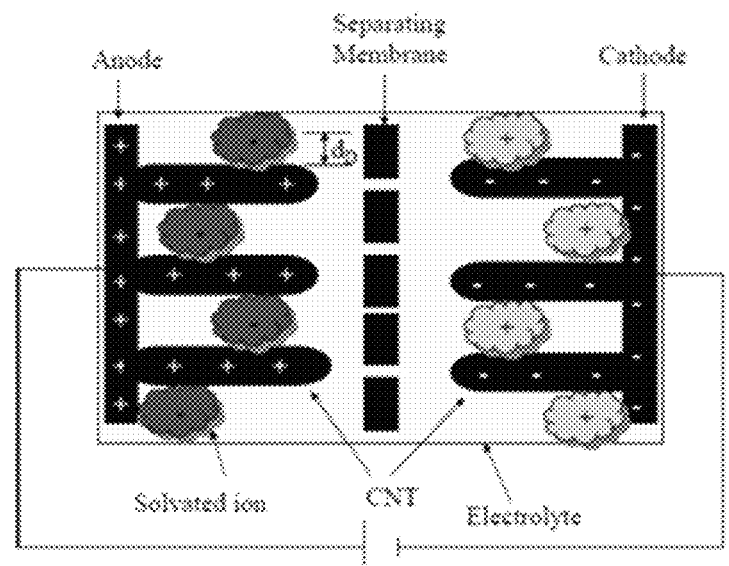
Figure 2

| ALD Cycles | Specific Capacitance (F/g) | | | |
|---|---|---|---|---|
| Voltage Scan Rate (mV/s) | 5 | 20 | 50 | 100 |
| Control | 23.7±7.2 | 15.0±5.6 | 11.4±4.7 | 9.1±3.6 |
| 100 | 25.0±13.5 | 22.2±2.6 | 17.8±2.8 | 12.0±5.0 |
| 200 | 72.8±15.3 | 51.3±4.7 | 16.5±19.3 | 14.8±11.7 |
| 300 | 53.9±12.2 | 39.9±7.3 | 31.3±15.4 | 10.7±1.1 |

Figure 9

Silicon wafer

PECVD on SiO$_2$ on front-side

Spin coat front-side with SPR 220-7 photoresist

Front-side photolithography for CNT cavities

SiO$_2$ etch in BOE solution

DRIE of CNT cavities in Si

Electron beam deposition of Fe catalyst layer

Spin coat back-side with SPR 220-7 photoresist

Back-side photolithography for electrolyte fill holes

DRIE of back-side electrolyte fill holes

Photoresist removal and wafer cleaning

Die separation and CNT growth

Bond cells together

Fill with RTIL and seal

CHIP-SCALE EMBEDDED CARBON NANOTUBE ELECTROCHEMICAL DOUBLE LAYER SUPERCAPACITOR

CROSS REFERENCE TO RELATED APPLICATIONS

This application is a U.S. National Stage of International Patent Application No. PCT/US2015/032329, filed May 24, 2015, entitled "Chip-Scale Embedded Carbon Nanotube Electrochemical Double Layer Supercapacitor", which claims priority to U.S. Provisional Patent Application No. 62/002,812, filed May 24, 2014, entitled "Chip-Scale Embedded Carbon Nanotube Electrochemical Double Layer Supercapacitor," and U.S. Provisional Patent Application No. 62/156,977, filed May 5, 2015, entitled "Chip-Scale Embedded Carbon Nanotube Electrochemical Double Layer Supercapacitor," the contents of of which are all fully incorporated herein by reference.

STATEMENT OF FEDERALLY SPONSORED RESEARCH

This invention was made with Government support under Grant No. HQ0727-14-P-1426. The U.S. Government has certain rights in this invention.

TECHNICAL FIELD

Various embodiments of the present invention relate generally to microscale capacitors constructed using paired carbon nanotube structures that creates a supercapacitor. One type of capacitor can be an electrochemical double layer capacitor. Another type of capacitor can be an electrochemical interdigitated capacitor.

BACKGROUND

With the rise of microelectronics, conventional circuitry is under constant modification, especially the internal electrical components to fit increasingly tight constraints. Electronics has made a shift from micro to nano-scale devices within the past decade. With the increase in the miniaturization, electrical components, such as resistors, batteries, and transistors have been modified and redeveloped to fit the physical and mechanical characteristics of nano-scale electrical environments. Silicon based printed circuit boards have started to shrink in size, utilizing different methods of integrating these miniscule components. Recently, the integration of electrical components within the board itself has been an area of development. In specific, the need for high-energy capacitors has risen.

Capacitors have the capability of holding high charge densities and rapid discharges of energy. This holds ample utilizations within circuitry and device development. However, the reduction of device sizes has rendered conventional components null due to the synonymous energy requirements to present electronics. Electrochemical double layer capacitors (ECDL), otherwise known as supercapacitors, allow for higher power and energy than traditional capacitors. Furthermore, carbon nanotube (CNT) based supercapacitors have provided exceeding improvements over ECDLs. Carbon nanotubes have been heavily studied in the development of capacitors. The scale of function of these ECDLs is drastically smaller than conventional capacitors. Furthermore, it has been shown to possess capacitances from 15-200 F/g, depending on the active surface area. This shows great viability for supercapacitor technology using CNTs.

Most current capacitor designs are based on the traditional coin structure and follow the stack system, as shown in FIG. 1A. This system utilizes three dimensional space, building the capacitor in between two metal contacts, such as shown in FIG. 1B. Thus, most of current supercapacitor technology has revolved around this cell-based structure, modeling those similar to current capacitor designs.

BRIEF SUMMARY

Embodiments of disclosure are directed to various aspects of electrochemical supercapacitors based on CNT structures in a silicon wafer, and methods of making the same.

An embodiment of the disclosure can be an electrochemical double-layer capacitor having a bottom substrate having a first cavity; a first plurality of substantially aligned carbon nanotubes vertically disposed within the first cavity; a top substrate having a second cavity facing the first cavity; a second plurality of substantially aligned carbon nanotubes vertically disposed within the second cavity; and a gap between the first plurality of substantially aligned carbon nanotubes and the second plurality of substantially aligned carbon nanotubes, wherein a gap height prevents contact between the first plurality of substantially aligned carbon nanotubes and the second plurality of substantially aligned carbon nanotubes.

Another embodiment of the disclosure can be an electrochemical double-layer capacitor having a bottom substrate having a first cavity; a first plurality of substantially aligned carbon nanotubes vertically disposed within the first cavity, wherein at least a portion of the first plurality of carbon nanotubes are functionalized with a faradaic material and a non-faradaic material; a top substrate having a second cavity facing the first cavity; a second plurality of substantially aligned carbon nanotubes vertically disposed within the second cavity wherein at least a portion of the second plurality of carbon nanotubes are functionalized with a faradaic material and a non-faradaic material; a gap between the first plurality of substantially aligned carbon nanotubes and the second plurality of substantially aligned carbon nanotubes, wherein a gap height prevents contact between the first plurality of substantially aligned carbon nanotubes and the second plurality of substantially aligned carbon nanotubes.

Another embodiment of the disclosure can be an electrochemical double-layer capacitor having a bottom substrate having a first cavity; a first plurality of substantially aligned carbon nanotubes vertically disposed within the first cavity; a top substrate having a second cavity facing the first cavity; a second plurality of substantially aligned carbon nanotubes vertically within the second cavity; a gap between the first plurality of substantially aligned carbon nanotubes and the second plurality of substantially aligned carbon nanotubes, wherein a gap height prevents contact between the first plurality of substantially aligned carbon nanotubes and the second plurality of substantially aligned carbon nanotubes; wherein at least one of the bottom substrate and the top substrate comprises a filling port configured to receive a room-temperature ionic liquid electrolyte.

Some embodiments of the electrochemical double-layer capacitors described above can include at least a portion of the first and second plurality of carbon nanotubes being functionalized with a non-faradaic material. Some embodiments of the electrochemical double-layer capacitors described above can include at least a portion of the first and second plurality of carbon nanotubes being functionalized with a faradaic material. Some embodiments of the electrochemical double-layer capacitors described above can include at least a portion of the first and second plurality of carbon nanotubes being functionalized with a both a non-faradaic and a faradaic material. The non-faradaic material can include graphene platelets on the CNTs. The faradaic material can include metal oxides, including metal oxides selected from the group consisting of ruthenium oxides, manganese oxides, iron oxide, tin oxides, vanadium oxides, titanium oxides, iridium dioxides, cobalt oxides, nickel oxides, indium oxides, copper oxides, and zinc oxides. The faradaic material can include titanium oxide or ruthenium oxide.

Some embodiments of the electrochemical double-layer capacitors described above can include at least one of the bottom substrate and the top substrate having a filling port. The bottom substrate and the top substrate can also include a gasket proximate the filling port. The gasket can be polylactic acid. In some embodiments, the capacitor can include an electrolyte disposed on at least a portion of the electrochemical double-layer capacitor. The electrolyte can be an ionic liquid, preferably a room temperature ionic liquid.

Some embodiments of the electrochemical double-layer capacitors described above can include a micropackage located between the bottom substrate and the top substrate, wherein a top end of the micropackage is proximate a bottom end of the top substrate and a bottom end of the micropackage is proximate a top end of the bottom substrate. In some embodiments, the height of the first plurality of carbon nanotubes does not exceed the bottom end of the micropackage and the height of the second plurality of carbon nanotubes does not exceed the top end of the micropackage. In some embodiments, the gap height between the two pluralities of CNTs is from about 5 micron to about 100 micron, about 10 micron to about 100 micron, about 10 micron to about 75 micron, or about 10 micron to about 50 micron.

Some embodiments of the electrochemical double-layer capacitors described above can have a gravimetric energy density of the active materials of the unpackaged capacitor that is from about 100 Whr/kg to about 1000 Whr/kg. The gravimetric energy density can be gravimetric energy density can be at least about 95 Whr/kg, at least about 100 Whr/kg, at least about 110 Whr/kg, at least about 120 Whr/kg, at least about 140 Whr/kg.

Another embodiment of the disclosure can be an electrochemical interdigitated capacitor having a substrate having a cavity therein; a first electrode comprising a first plurality of substantially aligned carbon nanotubes disposed thereon; a second electrode comprising a second plurality of substantially aligned carbon nanotubes disposed thereon; a separation distance between the first electrode and the second electrode such that the first electrode does not contact the second electrode; wherein the first electrode and the second electrode are planar. In some embodiments, the separation distance between the first electrode and the second electrode can be from about 5 micron to about 20 micron.

The electrochemical interdigitated capacitor can further include a micropackage. The electrochemical interdigitated capacitor can further include a lid disposed on the micropackage. The electrochemical interdigitated capacitor can further include that a top end of the micropackage is proximate the lid and the height of the first and second plurality of substantially aligned carbon nanotubes does not exceed a bottom end of the micropackage.

Some embodiments of the electrochemical interdigitated capacitor can include at least a portion of the first and second plurality of carbon nanotubes being functionalized with a non-faradaic material. Some embodiments of the electrochemical interdigitated capacitor can include at least a portion of the first and second plurality of carbon nanotubes being functionalized with a faradaic material. Some embodiments of the electrochemical interdigitated capacitor can include at least a portion of the first and second plurality of carbon nanotubes being functionalized with a both a non-faradaic and a faradaic material. The non-faradaic material can include graphene platelets on the CNTs. The faradaic material can include metal oxides, including metal oxides selected from the group consisting of ruthenium oxides, manganese oxides, iron oxide, tin oxides, vanadium oxides, titanium oxides, iridium dioxides, cobalt oxides, nickel oxides, indium oxides, copper oxides, and zinc oxides. The faradaic material can include titanium oxide or ruthenium oxide.

Some embodiments of the electrochemical interdigitated capacitor can include at least one of the lid or the substrate having a filling port, and can include a gasket proximate the filling port. The gasket can be polylactic acid. In some embodiments, the capacitor can include an electrolyte disposed on at least a portion of the electrochemical interdigitated capacitor. The electrolyte can be an ionic liquid, preferably a room temperature ionic liquid.

An embodiment of the disclosure can also include a method of fabricating an electrochemical double-layer capacitor, including the steps of providing a bottom substrate, etching a first cavity within the bottom substrate, growing a first plurality of substantially aligned carbon nanotubes within the first cavity, providing a top substrate, etching a second cavity within the top substrate, growing a second plurality of substantially aligned carbon nanotubes within the second cavity, and providing a micropackage, wherein a height of the micropackage defines a gap between the first plurality of substantially aligned carbon nanotubes and the second plurality of substantially aligned carbon nanotubes such that there is no contact between the first plurality of substantially aligned carbon nanotubes and the second plurality of substantially aligned carbon nanotubes.

In some embodiments, the method can further include functionalizing the first and second plurality of substantially aligned carbon nanotubes with at least one of a faradaic and non-faradaic material. The method can further also include filling an electrolyte into the capacitor. The electrolyte can be filled through a filling port. And the filling port can be located in at least one of the bottom and top substrates. The method also further includes disposing a gasket proximate the filling port, and the electrolyte can be disposed through the filling port via vacuum filling.

BRIEF DESCRIPTION OF THE FIGURES

FIGS. 1A and 1B illustrate a coin-cell capacitor typical in the prior art.

FIG. 2 illustrates a generic structure of a carbon nanotube based ECDL analogous to some embodiments of the disclosure.

FIG. 9 presents a table of increasing specific capacitance for atomic layer deposition of TiO$_2$ on CNTs, in accordance with some embodiments of the disclosure.

DETAILED DESCRIPTION

Figure 3A:
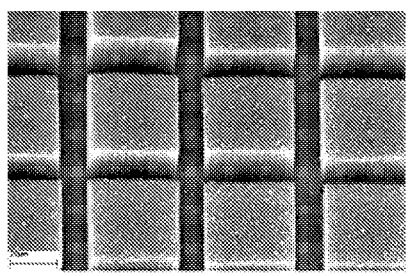
FIGS. 3A, 3B and 3C illustrate SEM images of materials produced using methods associated with construction of the disclosed supercapacitors, in accordance with some embodiments of the disclosure.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

As used herein, the height of a capacitor refers to the direction parallel to the substantially aligned carbon nanotubes, as disclosed herein, and width and length are directions in-plane with the first and second substrates in the electrochemical capacitors.

Described herein are electrochemical double-layer (ECDL) capacitors, or supercapacitors, that have tremendous potential as high-power delivery energy storage elements in low-volume and low-weight microelectronics systems, and can rival conventional batteries in terms of energy capacities. Traditional ECDL approaches utilizing activated carbon have limitations imposed by the structure of their pores. ECDL electrodes as described herein, based on nanostructured carbon, offer improved performance due to their high surface area, high-conductivity, increased porosity, and options for functionalization that enhance surface area and pseudocapacitance. Nanostructured ECDL capacitors have the potential to achieve performance levels applicable to the large-scale energy needs of electric vehicles, electromechanical actuators, and portable power supplies, as well smaller scale needs in microelectronics systems including pulsed wireless communication, embedded sensors, smart structures, wearable electronics and smart textiles. To realize their potential, ECDL technologies need to be miniaturized while simultaneously improving upon performance issues such as volumetric energy density and charge leakage. Fabrication options are also required that are compatible with conventional microelectronics fabrication to realize microelectronics components with integrated energy storage. Methods and devices that achieve these benefits are disclosed herein.

Decreasing size of the capacitor allows for capacitor-dependent devices to drastically shrink. By using ECDLs, not only does the size of capacitor decrease, but also the number of capacitors due to the large capacitance of a supercapacitor. A planar supercapacitor design has the potential to be largely incorporated within PCBs and other devices. In one design, vertically-grown, interlocking CNT forests have shown to have success utilizing a Si base. Not only does the design prove the concept of planar capacitors, but it also allows for the integration of these capacitors using silicon wafers. Furthermore, it has been shown that conventional capacitors can be developed on the surface of integrated circuits. Most stacks are generally constructed on the top silicon wafers rather than incorporated. Further studies have also suggested the idea of using highly doped silicon covered with graphene as electrode material in itself. Similarly, it has been shown that graphene based supercapacitors can hold the equivalent energy of a lithium battery.

The combination of concepts mentioned above leads to the creation of a capacitor implemented within the etched pits of a Si wafer, as disclosed herein. Not only does this allow integration of nano-scale capacitors within the wafer, but also allows for the space utilization and size reduction of these wafers while holding massive amounts of charge. Moreover, this design can be implemented within printed circuit board technologies, leading to unique ways of capacitor development.

A typical "coin cell" version of a capacitor, relying on non-aligned CNTs, can be assembled as shown in FIG. 1B. A mat of tangled carbon nanotubes is first placed into the coin cell on top of the bottom ("outer") electrode. A separator sheet, such as polypropylene and polyethylene barriers, is then added, followed by a second mat of tangled CNT material. Electrolyte is then poured into the cell. Issues such as the size of the pores in the electrodes and the wettability of the electrolyte factor into the ion diffusion characteristics of the resulting capacitor. Finally, the top ("inner") electrode is placed within the cell and clamped to seal against a gasket.

While the performance of the coin-cell format of this simple tangled mat CNT ECDL is promising, achieving over 3 Wh/kg, miniaturizing the structure for application in microelectronics and printed circuit boards represents significant challenges. In particular, the use of a tangled mat of CNT material makes attaining desirable levels of volumetric and gravimetric density challenging. In addition, the processes used to make CNT-based coin cell ECDL components are not immediately amenable to microelectronics fabrication. Thermal CVD growth parameters require high-temperature processing at over 600° C. Recent advances in Plasma Enhanced deposition have reduced those temperatures to as low as 400° C., making the process potentially compatible with microelectronics and some flexible substrates Localized heating has also been employed to increase compatibility. Furthermore, functionalization and pseudocapacitive coatings can realize significant gains in capacity.

Initial efforts in this disclosure demonstrated a variety of ECDL structures based on carbon nanotube approaches. Specific gravimetric densities up to 91 Wh/kg have been achieved in a coin cell format using a combination of carbon nanotube (CNT) growth, functionalization, and coating techniques. The generic structure of a carbon nanotube based ECDL is shown in FIG. 2. The two electrodes are composed of nanostructured carbon material placed in direct contact with an electrical conductor. In this initial example, an ion permeable separating membrane keeps the electrodes from short circuiting while also allowing ion diffusion through electrolyte encapsulated within an external casing.

Miniaturization of the ECDL can, therefore, be achieved using a combination of several different options, including micropatterned and vertically-aligned carbon nanotube sheets that replace tangled CNT mats and provide higher surface areas and porosity; three-dimensional nanotube architectures that reduce intrinsic inactive features; graphene-functionalized nanotubes that dramatically increase total surface area; pseudocapacitive coatings that add to the total capacitance of ECDL electrodes; low-temperature plasma-enhanced chemical vapor deposition (PECVD) CNT growth that provides potential process compatibility with microelectronics components; and microfluidic techniques that incorporate liquid electrolyte into a microfabricated chip.

Figure 3B:
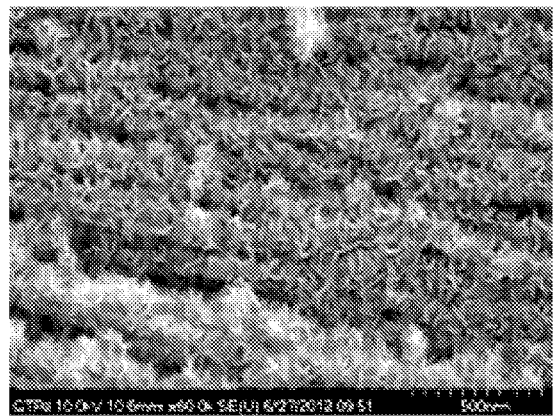
Figure 3C:
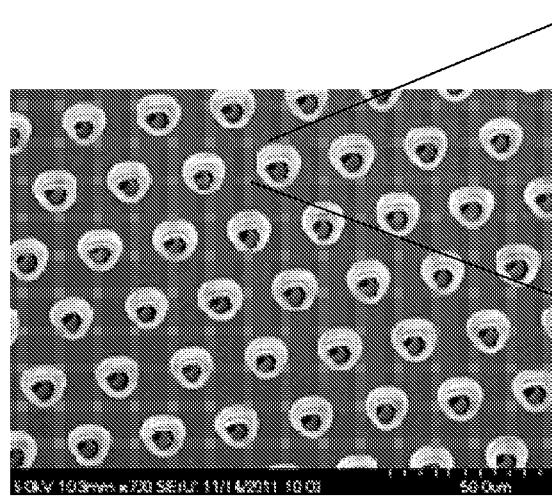
Figure 3C:
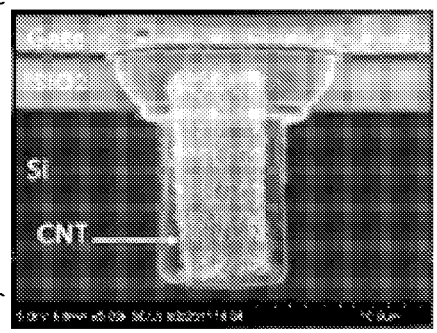

A variety of techniques can be used to grow patterned forests of vertically-aligned functionalized nanotubes in 3-dimensional arrangements, such as in FIGS. 3A, 3B and 3C. Vertically-aligned towers of CNT's can be grown and patterned, through standard photolithography processes, at specific locations on a substrate, allowing electrochemical supercapacitor architectures including interdigitated electrodes and arrays. As shown in FIG. 3A, advanced CNT growth, patterning, and functionalization approaches enables the miniaturization of ECDL components while increasing performance specifications. Nanotubes can be functionalized with a variety of groups that can increase pseudocapacitance and/or surface area. FIG. 3B shows graphene functionalized carbon nanotubes, a functionalization approach that dramatically increases the surface area of the electrode. In addition, aligned CNTs can now also be grown within etched cavities of silicon wafers, enabling three dimensional ECDL architectures (FIG. 3C, with enlarged section for individual pit.)

Figure 4A:
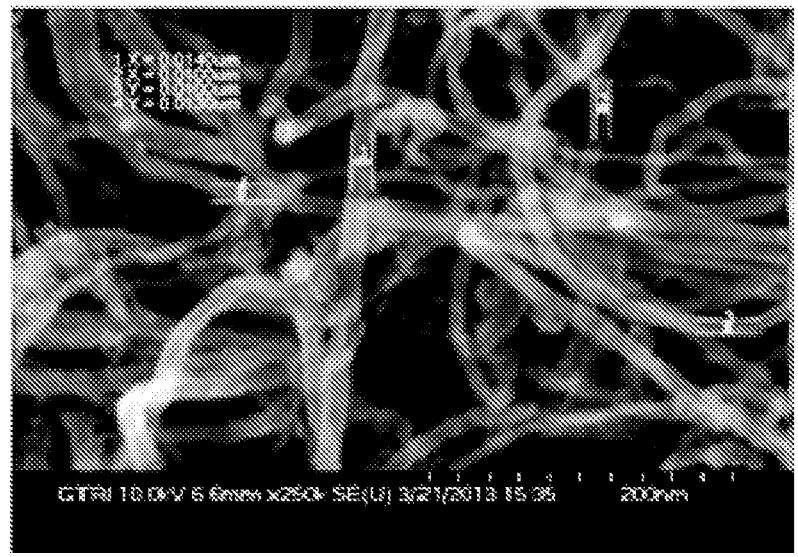
FIGS. 4A and 4B illustrate SEM images of uncoated and TiO$_2$-coated CNTs, in accordance with some embodiments of the disclosure.
Figure 4B:
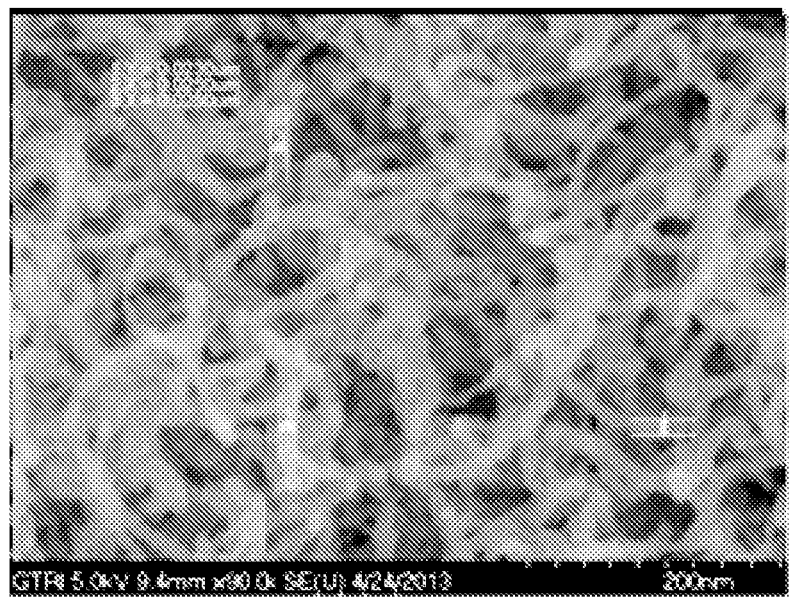

In addition, oxidation and reduction reactions achieved through pseudocapacitive coatings or nanotube functionalization can yield a substantial increase in ECDL performance. As an example, through atomic layer deposition (ALD), vertically-aligned CNT forests have been coated with titania (uncoated, FIG. 4A; coated, FIG. 4B.) After adding 8 nm of uniform coating, the gravimetric energy density increased to over 91 Wh/kg, with a series resistance of only 1.11 Ohms.

These advanced fabrication approaches enabled miniaturization of the ECDL capacitor while improving volumetric and gravimetric density. High capacity low weight supercapacitors are now accessible, which utilize CNTs structures and ionic liquid electrolytes to achieve these high capacitance and large gravimetric energy densities. Moreover, due to the nature of these structures and the techniques involved, the supercapacitors will have increased applicability and integration into microelectronics, which were often hampered by the lack of miniaturization of capacitors. The goal of 100+Wh/kg is now attainable, using Si wafer embedded technology, vertically aligned carbon nanotubes, some combination of faradaic and/or non-faradaic functionalization, and ionic liquids as electrolytes.

Figure 5:
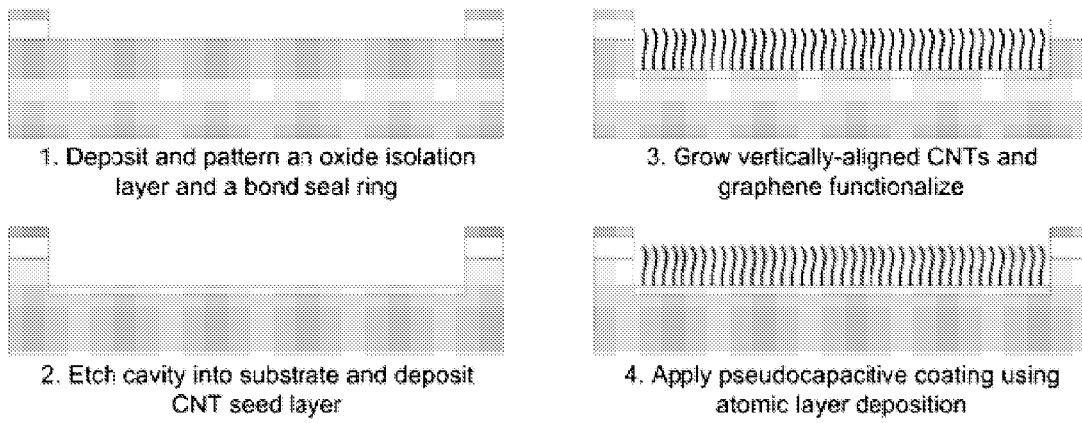
FIG. 5 illustrates a general process for preparing a half of a ECDL capacitor, in accordance with some embodiments of the disclosure.
Figure 6:
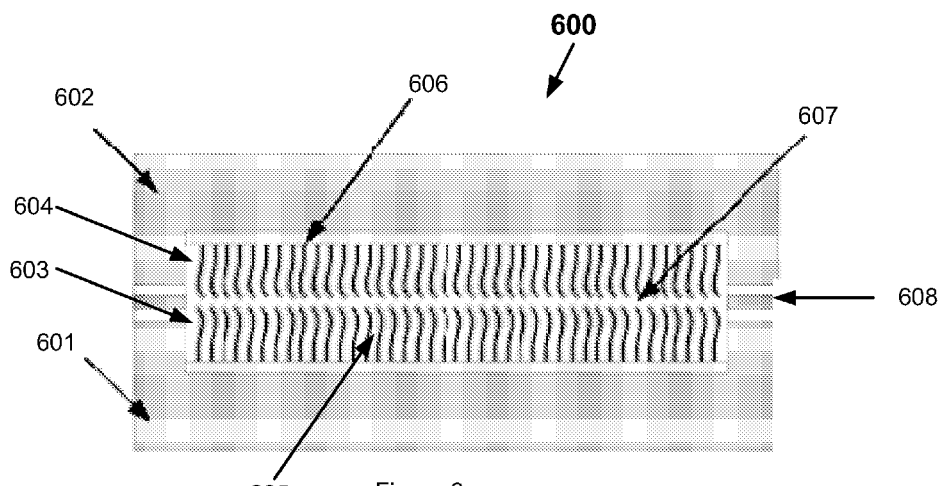
FIG. 6 illustrates an ECDL capacitor, in accordance with some embodiments of the disclosure.

Supercapacitors as disclosed herein can be based on two potential approaches: a 3-D stacking approach and an interdigitated electrode approach. In the 3-D stacking approach, a single microelectrode can be fabricated, using for example a process as shown in FIG. 5. A single electrode can be fabricated with all of the features required of an ECDL, including cavities to hold electrolyte, nanostructured carbon in the form of graphene functionalized vertically-aligned carbon nanotubes, as well as both physical and electrical separation of electrodes. The process can include depositing and patterning an oxide isolation layer and a bond seal ring, etching a cavity into the substrate and depositing the CNT seed layer, growing vertically aligned CNTs and functionalizing with graphene, then applying a pseudocapacitive coating using atomic layer deposition. The CNT forests can be grown in electrically isolated shallow wells within a substrate. In addition, PECVD growth processes for CNTs have moved to lower temperature processing parameters, making CNT growth possible on microelectronics substrates as well as flexible materials. After the fabrication of a single electrode, a full ECDL capacitor can be realized by capping one electrode with a second identical copy, as shown in FIG. 6. This structure, with electrodes separated by a well-controlled gap, removes the requirement for a separator sheet, thereby achieving higher levels of volumetric density. It also exhibits high porosity and surface area due to the vertically-aligned graphene-functionalized carbon nanotubes. Furthermore, ALD processes can create conformal pseudocapacitive coatings that greatly increase the overall capacity of the structure. Finally, it is also relatively simple to fabricate using process steps that are compatible with traditional microelectronics approaches and that minimize wasted space that does not contribute to volumetric density.

Figure 7:
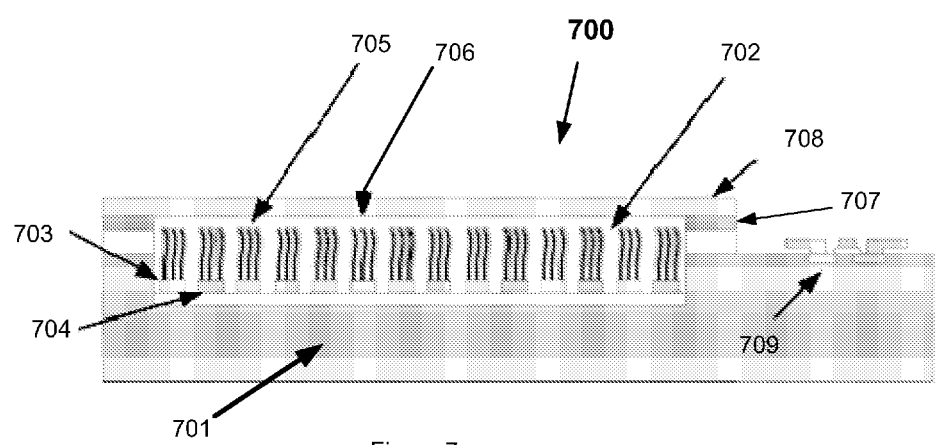
FIG. 7 illustrates an electrochemical interdigitated capacitor, in accordance with some embodiments of the disclosure.

In addition to the vertical structure of the ECDL capacitor, a planar structure can be fabricated to create interdigitated arrays of electrodes in a planar configuration, as shown in FIG. 7. In the planar approach, all of the nanostructures are on the same level within the chip, but are interdigitated to yield two electrodes in close proximity. In this approach, capping and electrolyte injection can be significantly simpler, as would incorporation in a flexible substrate. Either of these micro-capacitor configurations could be integrated as either a multichip module with the microelectronics to be powered, or as a component fabricated directly on the same microelectronic substrate.

An electrolyte is typically required for conductance, but bonding to create cavities can preferably be performed without electrolyte present, as bonding processes can be difficult with liquid material residing in the cavity. Therefore, electrolyte can be placed within the cavity after bonding. The disclosure includes processes for capping microfluidic cavities containing nanostructured material and placing fluid within the cavities after completion. In the process, electrolyte degasification can be achieved through vacuum infiltration and the cavity can be sealed using frit compression of a low-temperature thermoplastic polymer.

Figure 8A:
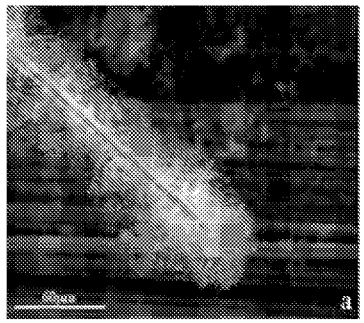
FIGS. 8A, 8B, and 8C illustrate SEM images of CNTs that can be controlled and grown in the electrochemical supercapacitors, in accordance with some embodiments of the disclosure.
Figure 8B:
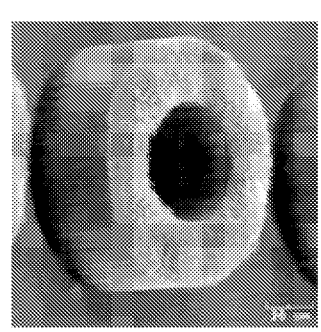
Figure 8C:
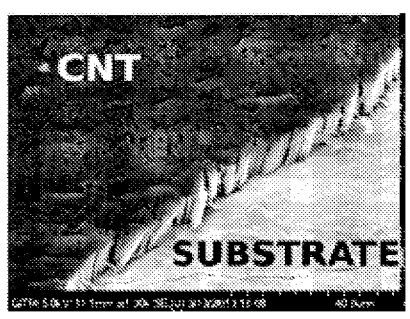

By altering the electrolyte composition and active electrode material attributes, CNT-based supercapacitor performance can be markedly altered. The results from constant current and constant voltage tests include specific capacitance and equivalent series resistance (ESR) determinations. Improved packaging, sealing and manufacturing techniques markedly reduce ESR and leakage current in the product. Specifically, a variety of growth processes have been demonstrated on multiple substrates for patterned, vertically-aligned, and randomly-oriented nanotubes. CNTs can be grown as a random-orientation on carbon fiber (FIG. 8A), as patterned vertically-aligned CNTs (FIG. 8B), and as ALD-coated CNT forests (FIG. 8C). In addition, multiple functionalization approaches for CNT-based ECDL capacitors have been conducted. These have included graphene-functionalized CNT's, which presents a significant advantage in that the surface area is significantly increased. Finally, coatings for CNTs to enhance pseudocapacitive effects have been demonstrated, making significant gains in performance. For example, titania-coated CNT's, through conformal and low-temperature atomic layer deposition processes, has significantly increased capacity through pseudocapacitance, as shown in FIG. 9 for atomic layer deposition of pseudocapacitive coatings that increased capacity by a factor of three as measured using cyclic voltammetry.

Thus, in an embodiment, the disclosure can include an electrochemical double-layer capacitor 600, as shown in FIG. 6. The capacitor can include a bottom substrate 601 and a top substrate 602. The bottom substrate can include a first cavity 603, and the top substrate can include a second cavity 604. The substrates 601 and 602 are preferably silicon or other conductive substrate, preferably an n-doped silicon, and each can serve as an electrode for each side of the ECDL capacitor.

The first cavity and second cavity can face each other, which indicates that the open part of each cavity in the two substrates are directed towards each other, as shown in FIG. 6. The top and bottom cavity can also be aligned with each other. By aligned is meant that the two cavities are in alignment in the x-y plane of the two substrates. Alignment of the two cavities need not be perfect, meaning that all of one cavity does not need to align perfectly with the other cavity, nor do the cavities need to be the same size. However, decreases in the capacitance of the device might be observed when less than all of the two cavities are not aligned. Overlap of the two cavities should therefore be at least about 50% of the two dimensional surface area of at least one of the cavities, including at least about 66%, at least about 75%, at least about 80%, or at least about 90%.

Within the first cavity can be disposed a first plurality of substantially aligned carbon nanotubes 605. By substantially aligned carbon nanotubes is meant that the majority of the carbon nanotubes were grown in the same direction. In contrast to tangled masses or random piles of CNTs, the CNTs of this disclosure are closer to parallel with each other across the length of the CNTs, as can be seen in several figures disclosure herein. Within the second cavity can be disposed a second plurality of substantially aligned carbon nanotubes 606. In each of the first and second cavities, the carbon nanotubes can be vertically disposed within the cavity, as shown in FIG. 6. Note that the carbon nanotubes within a cavity need not be a continuous forest or vertical mat of aligned tubes, but could instead be separated into islands of CNTs with intervening stretches of unoccupied surface, such as was shown in FIG. 3A. The first and/or second cavity can be at least about 100 microns deep, at least about 110 microns deep, at least about 120 microns deep, or at least about 130 microns deep. The CNTs within the cavity can be about 50 to about 150 microns in height, about 75 microns to about 150 microns, or about 75 microns to about 125 microns. The CNTs can be less than 100% the height of the cavity, less than about 95% the height of the cavity, less than about 90% of the height of the cavity, less than about 80% of the height of the cavity, or less than about 75% of the height of the cavity.

The capacitor can also include a gap 607 between the first plurality of substantially aligned carbon nanotubes and the second plurality of substantially aligned carbon nanotubes. The gap described herein defines the separation space between the upper ends of the CNTs of the two sides of the capacitor. The gap can be described by a gap height, or separation height between the first and second plurality of CNTs. This gap height prevents contact of any of the first plurality of substantially aligned carbon nanotubes with any of the second plurality of substantially aligned carbon nanotubes. The gap height can be from about 5 microns to about 150 microns, from about 5 microns to about 100 microns, from about 10 microns to about 100 microns, or from about 10 microns to about 50 microns. The gap height can be less than about 125 microns, less than about 100 microns, less than about 75 microns, less than about 50 microns, less than about 40 microns or less than about 30 microns. The gap height can be great than about 2 microns, greater than about 5 microns, or greater than about 10 microns.

The capacitor can also include a micropackage 608 located between the bottom substrate 601 and the top substrate 602, wherein a top end of the micropackage is proximate a bottom end of the top substrate and a bottom end of the micropackage is proximate a top end of the bottom substrate. This configuration places the micropackage within the area where the gap or gap height is presented, and where a separator would typically be found. In the capacitor, the height of the first plurality of carbon nanotubes 605 would typically not exceed the bottom end of the micropackage and wherein a height of the second plurality of carbon nanotubes 606 would typically not exceed the top end of the micropackage.

The capacitors in this disclosure do not require a separator between two sides of the capacitor. The absence of a separator can allow for several advantages, including for example simpler construction, less material, faster response times and higher overall capacitance. The space between the two sides of the capacitor can include at least a portion of open space that is not occupied by a separator. In some embodiments, the separator can be completely absent. In some alternate embodiments, a separator could still be included, but a portion of the space still unoccupied by a separator. Preferably at least a portion of the open space is not occupied by a separator.

As shown in FIG. 6, the two halves of the ECDL capacitor are about equal height, and exhibit a rough symmetry between the two halves. In an embodiment, the capacitor can be approximately symmetric across the two halves, meaning that the differences in dimensions and shapes of the two halves are less than 10%. This symmetry can be preferred, at least in part because the manufacturing of the two halves can be achieved with the same process parameters. For example, a pair of substrates can be prepared that each have a cavity and a plurality of substantially aligned carbon nanotubes vertically disposed in the cavity, then one of the pair is flipped and placed atop the other substrate to form the capacitor. However, other embodiments could be considered wherein the height of the two halves could be unequal, even when the width and length are approximately the same. The ratio of the heights of the two halves can be greater than about 1:1. The ratio of the heights of the two halves can be less than about 1.1:1, less than about 1.2:1, less than about 1.5:1, less than about 2:1, less than about 2.5:1 or less than about 3:1, or less than about 5:1. Preferably, the ratio of the two halves can be about 1:1.

The capacitor can include in at least one of the substrates a filling port through which the electrolyte can be added. The capacitor can also include a gasket proximate the filling port to seal the port once the electrolyte has been added. The gasket can be any material suitable for this use, including for example polylactic acid.

As noted above, the capacitor of the current disclosure can include an electrolyte in the space between the two substrates that is occupied by the cavities and carbon nanotubes. The electrolyte can be any electrolyte compatible with the substrates and carbon nanotubes. In an embodiment, the electrolyte is an ionic liquid, or a room temperature ionic liquid. Examples of ionic liquids includes benzyldimethylpropylammonium aluminum tetrachlorate, benzyldimethyl ammonium imide, dimethylethyl ammonium imide, ethylmethyl ammonium bisulfate, 1-butyl-3-methylimidazolium tetraflouroborate.

As discussed above, at least a portion of the carbon nanotubes can be further functionalized to increase performance. The carbon nanotubes can include a non-faradaic material to improve the performance. The non-faradaic material can include graphene platelets, which can dramatically increase the surface area of the material. The carbon nanotubes can also be functionalized with a faradaic material. The faradaic material can be metal oxides, including for example, ruthenium oxides, manganese oxides, iron oxide, tin oxides, vanadium oxides, titanium oxides, iridium dioxides, cobalt oxides, nickel oxides, indium oxides, copper oxides, and zinc oxides. The faradaic material can preferably include titanium oxide or ruthenium oxide, preferably titanium oxide. The carbon nanotubes can include both of a faradaic material and a non-faradaic material, and each can include the examples cited above.

As discussed above, the disclosure can include a planar structure having an interdigitated arrays of electrodes, as was shown in FIG. 7. In an embodiment, the disclosure can include an electrochemical interdigitated capacitor 700. The capacitor can include a substrate 701 having a cavity 702 therein, and a first electrode 703 and a second electrode 704 within the cavity. The first electrode can include a first plurality of substantially aligned carbon nanotubes 705 disposed thereon, and the a second electrode can include a second plurality of substantially aligned carbon nanotubes 706 disposed thereon. The first and the second electrodes can be separated by a separation distance such that the first electrode does not contact the second electrode, and a positioned in a planar arrangement relative to the cavity. The capacitor can include a series of alternating first and second electrodes across the bottom the cavity, and a microelectronics section 709 that can provide a connection point to the series of first and second electrodes.

The separation distance of the interdigitated capacitor, between the first electrode and the second electrode, can be from about 3 to about 30 microns, or from about 5 micron to about 20 micron, or from about 5 to about 10 microns. The separation distance can be greater than about 3 microns or greater than about 5 microns, and less than about 30 microns, less than about 20 microns, less than about 15 micron, or less than about 10 microns.

The interdigitated capacitor can include a micropackage 707, and can further include a lid 708 disposed on the micropackage. The top end of the micropackage can be proximate the lid and the height of the first and second plurality of substantially aligned carbon nanotubes would typically not exceed a bottom end of the micropackage. Preferably, none of the first and second plurality of substantially aligned carbon nanotubes contact the lid.

As with the electrochemical double-layer capacitor described above, at least a portion of the first and second plurality of carbon nanotubes can be functionalized with a non-faradaic material, or can be functionalized with a faradaic material, or can be functionalized with both non-faradaic and faradaic material. The faradaic and non-faradaic materials are as described above. Additionally, as with the electrochemical double-layer capacitor above, the interdigitated capacitor can include a filling port in at least one of the lid or the substrate, and can include a gasket proximate the filling port. The interdigitated capacitor can include an electrolyte disposed on at least a portion of the interdigitated capacitor, and that electrolyte can include an ionic liquid, preferably a room temperature ionic liquid.

The disclosure can also include a supercapacitor having a gravimetric energy density of at least about 95 Whr/kg and/or a volumetric energy density of at least about 300 Whr/L. The gravimetric energy density can be at least about 95 Whr/kg, at least about 100 Whr/kg, at least about 110 Whr/kg, at least about 120 Whr/kg, at least about 140 Whr/kg. The gravimetric energy density can be up to about 1000 Whr/kg, up to about 750 Whr/kg, or up to about 600 Whr/kg. The volumetric energy density can be at least about 300 Whr/L, at least about 350 Whr/L, at least about 400 Whr/L, at least about 450 Whr/L, or at least about 500 Whr/L. The volumetric energy density can be up to about 4000 Whr/L. The supercapacitor can also achieve specific capacitance of at least about 75 F/g, at least about 80 F/g, at least about 90 F/g, or at least about 100 F/g.

As discussed previously, the disclosure also includes a method of fabricating the ECDL capacitor. The method can include providing a bottom substrate, etching a first cavity in to the bottom substrate, and growing a first plurality of substantially aligned carbon nanotubes within the first cavity. The top substrate can then be provided, and a second cavity etched within the top substrate, and then a second plurality of substantially aligned carbon nanotubes can be grown within the second cavity. One of skill in the art would understand that these two steps are interchangeable with respect to which one is conducted first. The next step can include providing a micropackage, wherein a height of the micropackage defines the minimum of a gap between the first plurality of substantially aligned carbon nanotubes and the second plurality of substantially aligned carbon nanotubes such that there is no contact between the first plurality of substantially aligned carbon nanotubes and the second plurality of substantially aligned carbon nanotubes.

The method can further include functionalizing the first and second plurality of substantially aligned carbon nanotubes with at least one of a faradaic and non-faradaic material. The faradaic and non-faradaic materials are as disclosed above.

The cavity of the capacitor can be filled with an electrolyte, where the electrolyte is filled through the filling port, located in at least one of the bottom and top substrates, and optionally disposed through the filling port via vacuum filling. A gasket can then be disposed proximate the filling port to seal the capacitor. The electrolyte can be as described above.

The method for preparing these devices and the technology in the devices themselves can be exemplified in the following nonlimiting example.

Figure 10A:
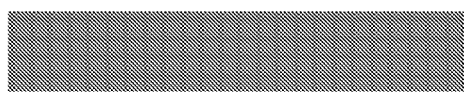
FIGS. 10A-10N illustrate detailed process steps for preparing an ECDL capacitor, in accordance with some embodiments of the disclosure.
Figure 10B:
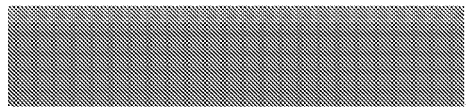
Figure 10C:
Figure 10D:
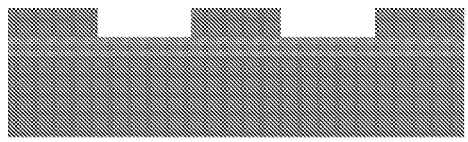
Figure 10E:
Figure 10F:
Figure 10G:
Figure 10H:
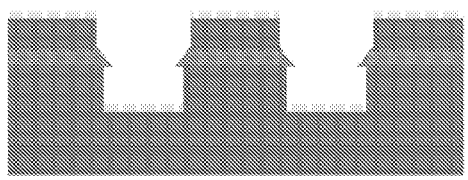
Figure 10I:
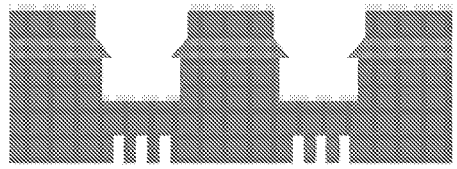
Figure 10J:
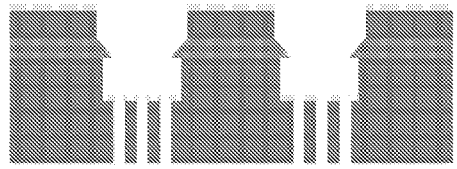
Figure 10K:
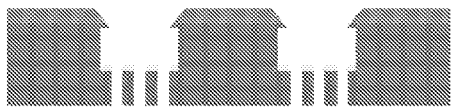
Figure 10L:
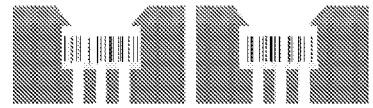
Figure 10M:
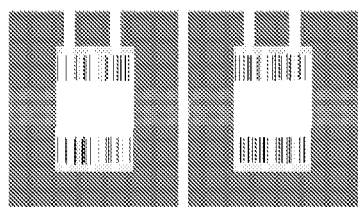
Figure 10N:
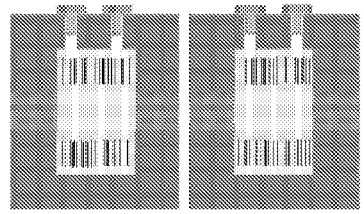

An ECDL capacitor was created according to the following steps, as exemplified in FIGS. 10A-N. An initial silicon wafer, FIG. 10A, had deposited by plasma-enhanced chemical vapor deposition a layer of silicon dioxide on the front side of the silicon wafer, FIG. 10B. The positive photoresist SPR220-7 was then spin-coated onto the front-side of the wafer, FIG. 10C, and front-side photolithography of the photoresist was conducted to form the initial cavities, FIG. 10D. The silicon dioxide was then etched using a buffered oxide etch (BOE), FIG. 10E, and then a deep-reactive ion etch (DRIE), such as a Bosch Plasma Etch (BPE) was used to dig cavities of the CNTs in the silicon, FIG. 10F. A layer of Fe catalyst for the CNT growth positions was deposited by electron beam deposition in the cavities, FIG. 10G.

A portion of the wafers were then treated backside to create the fill holes for electrolyte infusion. To the back-side of the wafer was spin-coated the positive photoresist SPR220-7, FIG. 10H, and back-side photolithography was conducted to position the fill holes, FIG. 10I. Deep reactive ion etch in FIG. 10J prepared the fill holes for the electrolyte. The remaining photoresist was removed and the wafers cleaned, FIG. 10K. CNT growth, functionalization with graphene and/or titania as a pseudocapacitive film, and die separation were conducted, FIG. 10L. Two sections were then bonded together, the top one of which contained the fill holes, FIG. 10M. The cavities were then filled with room temperature electrolyte and sealed, FIG. 10N.

Figure 11A:
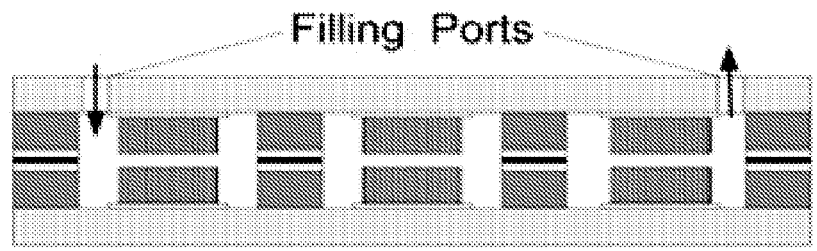
FIGS. 11A-11E illustrate detailed process steps for filling the capacitor with electrolyte and sealing the fill holes, in accordance with some embodiments of the disclosure.
Figure 11B:
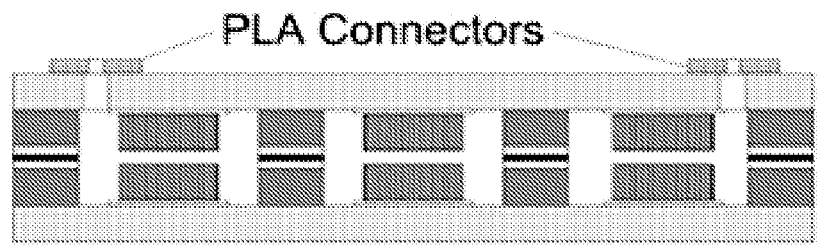
Figure 11C:
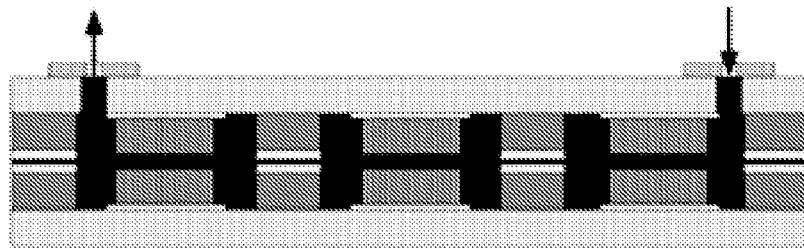
Figure 11D:
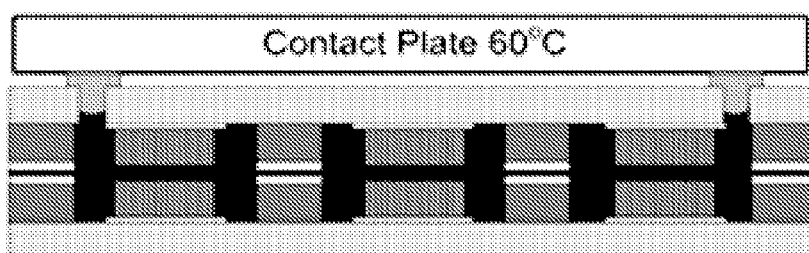
Figure 11E:
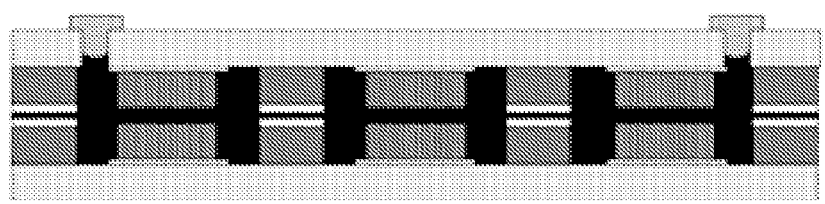

With respect to the electrolyte fill process, fill ports can be shown at least at two points on a wafer, as in FIG. 11A. Polylactic acid connectors can be added to the filling ports, FIG. 11B, and would eventually become the gasket that seals the device. The electrolyte can then be added to the capacitor by flowing it in one fill port while the other fill port is placed under vacuum to flow the electrolyte into the cavities of the capacitor, FIG. 11C. A contacting plate at 60° C. can be pressed against the PLA to form the gaskets, FIG. 11D and seal the final capacitor, FIG. 11E.

Figure 12:
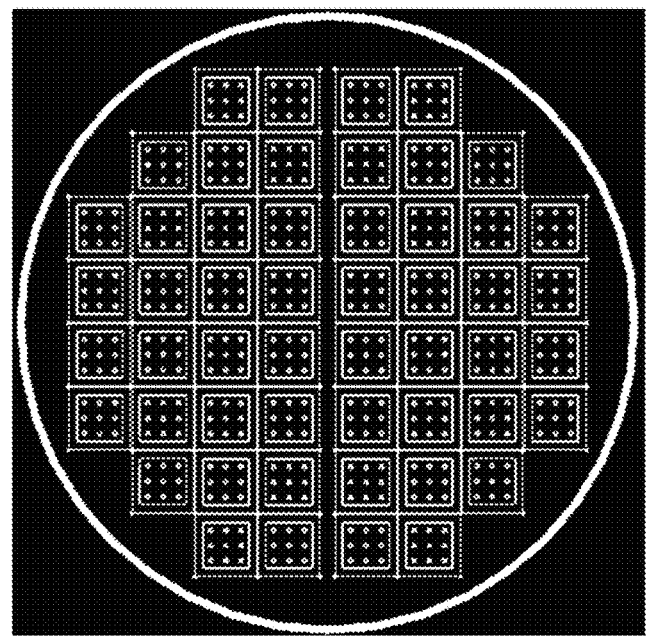
FIG. 12 illustrates a Si wafer used to prepare electrodes for ECDL capacitors, in accordance with some embodiments of the disclosure.
Figure 13A:
FIGS. 13A and 13B illustrate the top and backside of a single Si-CNT electrode, in accordance with some embodiments of the disclosure.
Figure 13A:
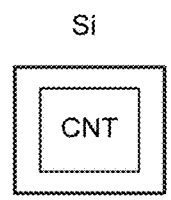
Figure 13B:
Figure 13B:
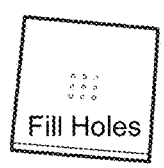

For the initial devices, a heavily doped silicon wafer was utilized, and the electrolyte initially used was 1-butyl-3-methylimidazolium tetrafluoroborate, (BMIM BF4). Fifty two electrodes per wafer were created, as shown in FIG. 12. An individual electrode is shown in FIG. 13A, showing the CNT side of the electrode, and FIG. 13B, showing the backside of an electrode, having the fill holes.

Figure 14A:
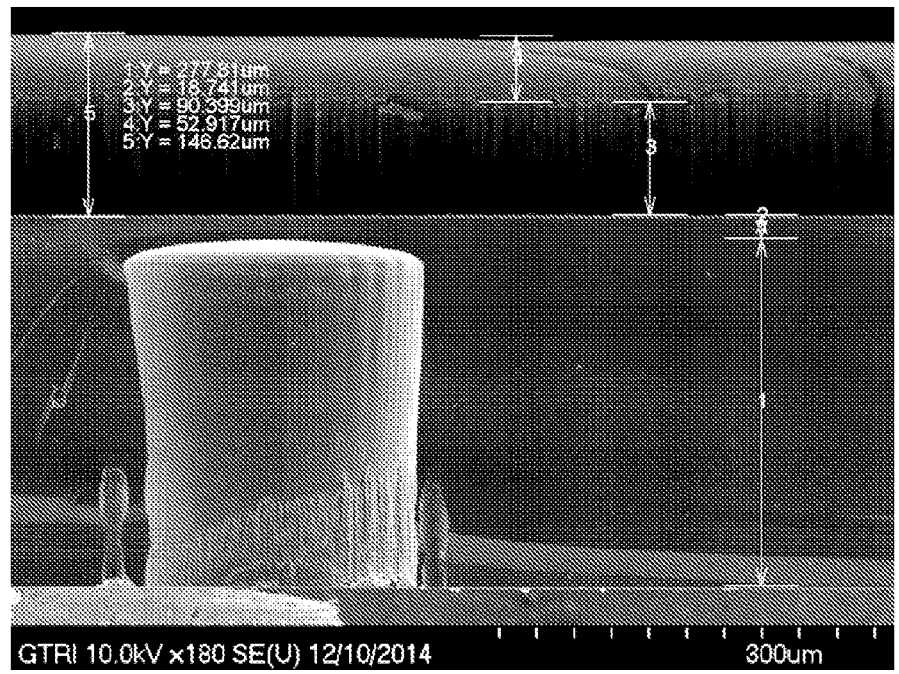
FIGS. 14A and 14B illustrate a crossectional SEM image of an Si-CNT electrode, in accordance with some embodiments of the disclosure.
Figure 14B:
Figure 15:
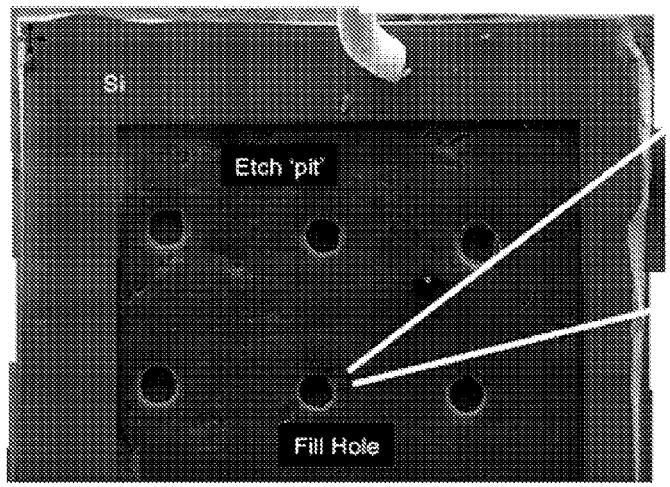
FIG. 15 illustrates an SEM image of the top-side of an Si-CNT electrode, in accordance with some embodiments of the disclosure.
Figure 16A:
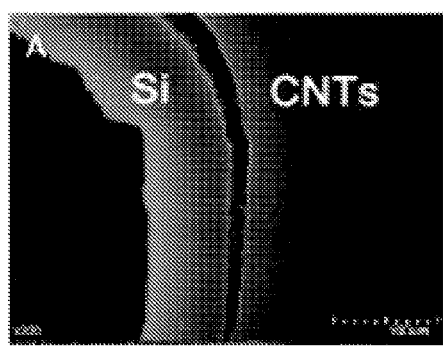
FIGS. 16A-16D illustrate enlarged views of the SEM image of FIG. 15, in accordance with some embodiments of the disclosure.
Figure 16B:
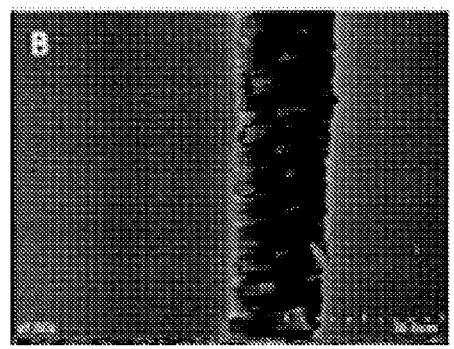
Figure 16C:
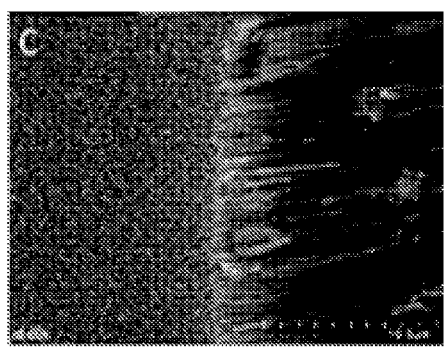
Figure 16D:
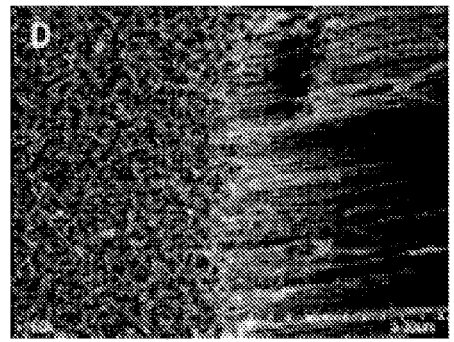

SEM images of an individual wafer are shown in FIGS. 14A-B, 15, and 16A-D. In FIG. 14A, a cross-sectional image shows the fill hole (1) in the silicon wafer, the depth of the etch pit (5), and the CNTs (3). A similar image is shown in FIG. 14B. FIG. 15 reveals the top-down view of the etch pit, including positions where the fill holes are placed. Section A in FIG. 15 is expanded in FIG. 16A, showing the fill hole, the silicon substrate near the hole, and the forest of CNTs growing around the holes. FIGS. 16B, 16C and 16D show higher magnifications of that CNT section from FIG. 16A.

Figures 17A, 17B:
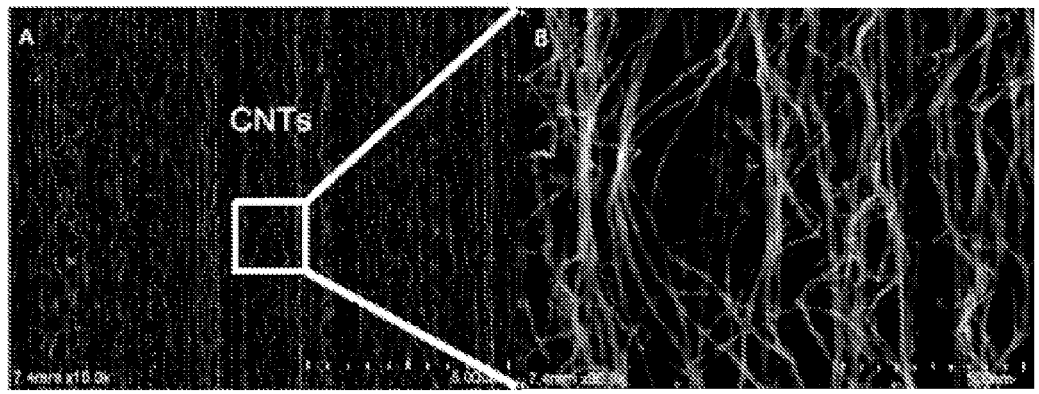
FIGS. 17A-17E illustrate SEM images of substantially aligned CNTs, including graphenated and coated version of the substantially aligned CNTs, in accordance with some embodiments of the disclosure.
Figures 17C, 17D:
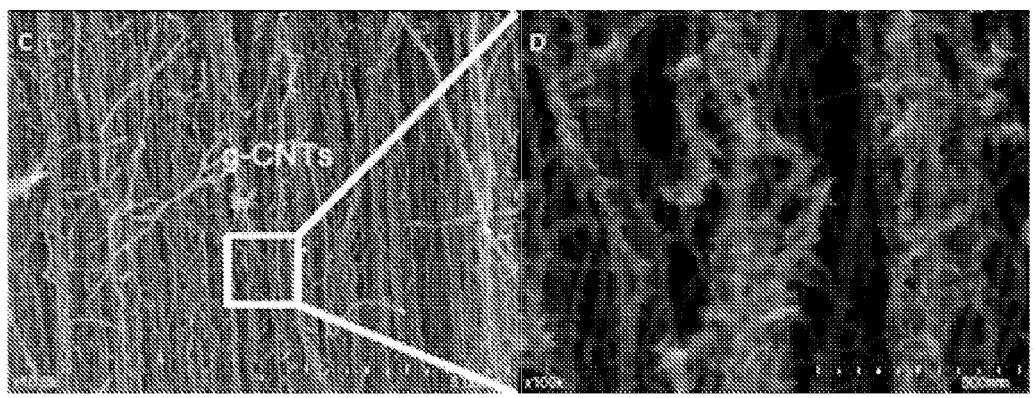
Figure 17E:
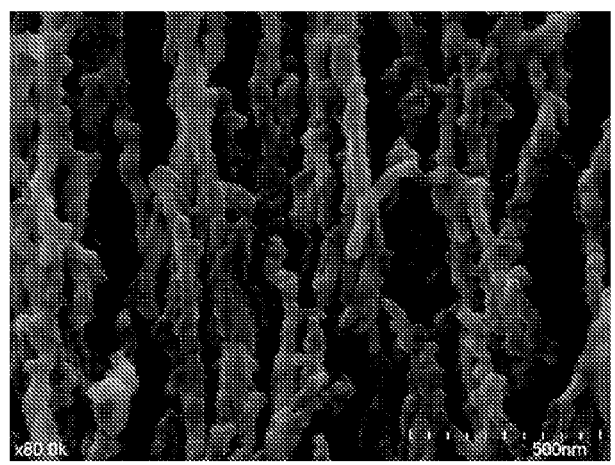

For the CNTs on the individual electrodes, samples were prepared having only CNTs, CNTs functionalized with graphene, CNTs functionalized with $TiO_2$, and CNTs functionalized with graphene and $TiO_2$. SEM images of CNTs (FIGS. 17A and 17B) and CNTs modified with graphene (FIGS. 17C and 17D) are shown, as is graphene modified CNTs that have been coated with $TiO_2$ (FIG. 17E.)

Figure 18:
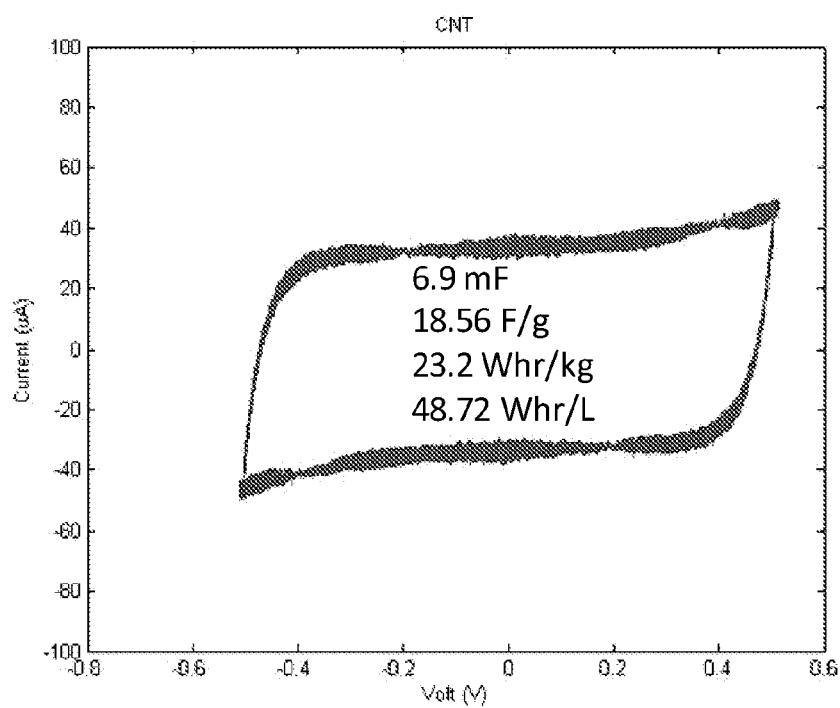
FIG. 18 illustrates the current-voltage graph of an unmodified CNT ECDL capacitor, in accordance with some embodiments of the disclosure.
Figure 19:
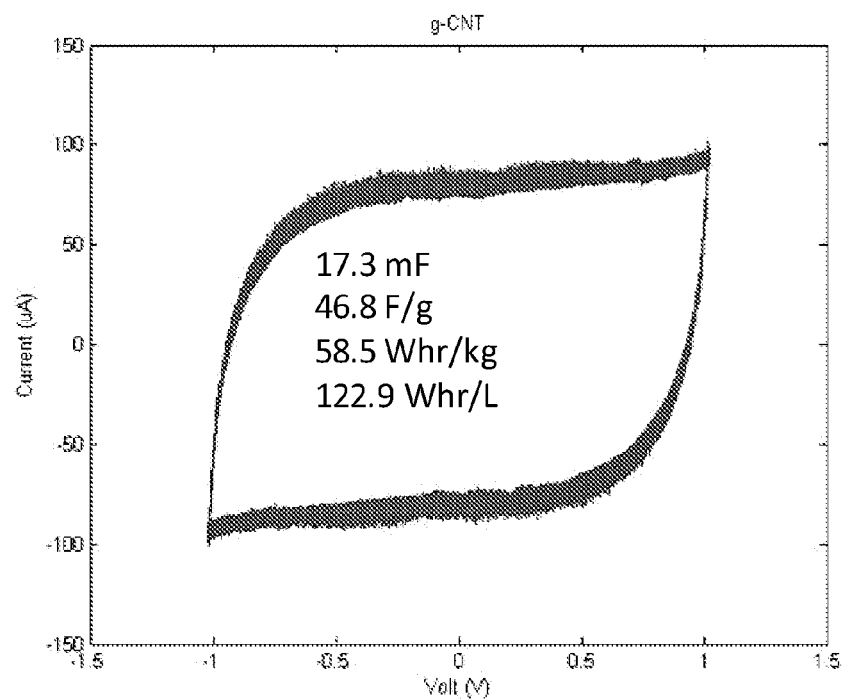
FIG. 19 illustrates the current-voltage graph of a graphene-modified CNT ECDL capacitor, in accordance with some embodiments of the disclosure.
Figure 20:
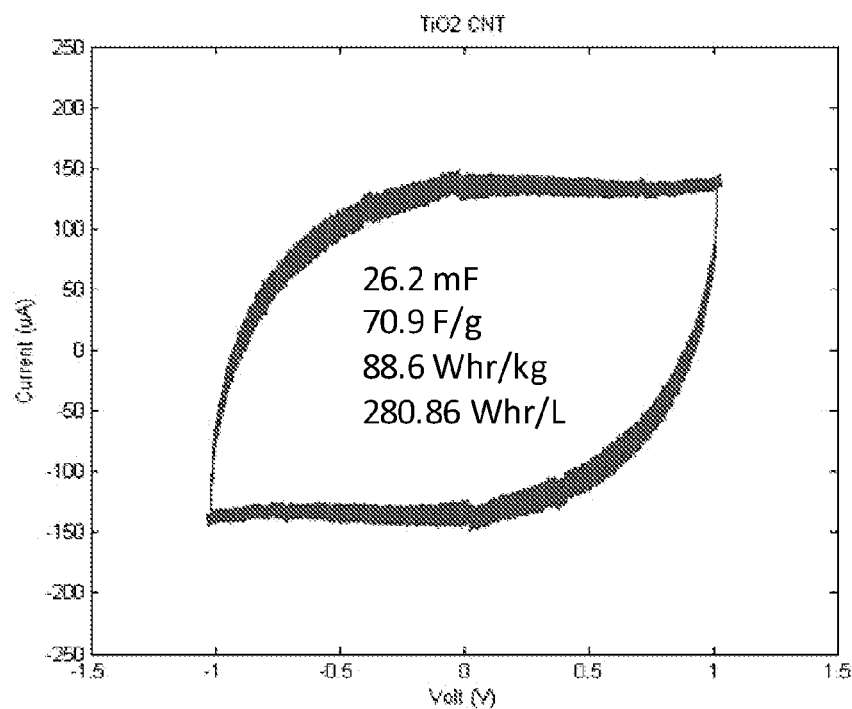
FIG. 20 illustrates the current-voltage graph of a TiO$_2$-coated CNT ECDL capacitor, in accordance with some embodiments of the disclosure.
Figure 21:
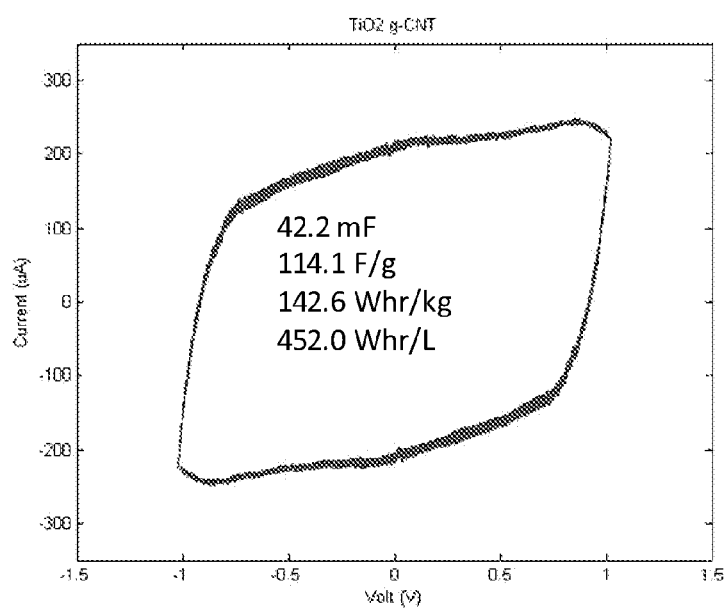
FIG. 21 illustrates the current-voltage graph of a graphene-modified TiO$_2$-coated CNT ECDL capacitor, in accordance with some embodiments of the disclosure.

Current-Voltage graphs were constructed for each of the capacitors constructed using only CNTs (FIG. 18), graphene-CNTs (FIG. 19), CNTs with $TiO_2$ (FIG. 20), and graphene-CNTs with $TiO_2$ (FIG. 21), and the energy density for each calculated. The graphs and results are shown together, and the results also listed in Table 1.

TABLE 1

|  | CNT | Graphene-CNT | CNT-$TiO_2$ | Graphene-CNT-$TiO_2$ |
| --- | --- | --- | --- | --- |
| Capacitance (mF) | 6.9 | 17.3 | 26.2 | 42.2 |
| Specific Capacitance (F/g) | 18.56 | 56.8 | 70.9 | 114.1 |
| Gravimetric energy density (Whr/kg) | 23.2 | 58.5 | 88.6 | 142.6 |
| Volumetric energy density (Whr/L) | 48.72 | 122.9 | 280.86 | 452.0 |

Figure 22:
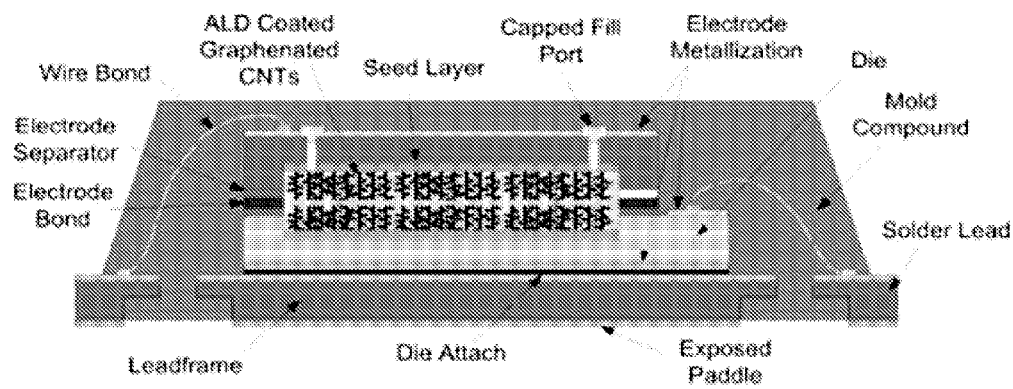
FIG. 22 illustrates an ECDL capacitor embedded in a mold compound, in accordance with some embodiments of the disclosure.
Figure 23:
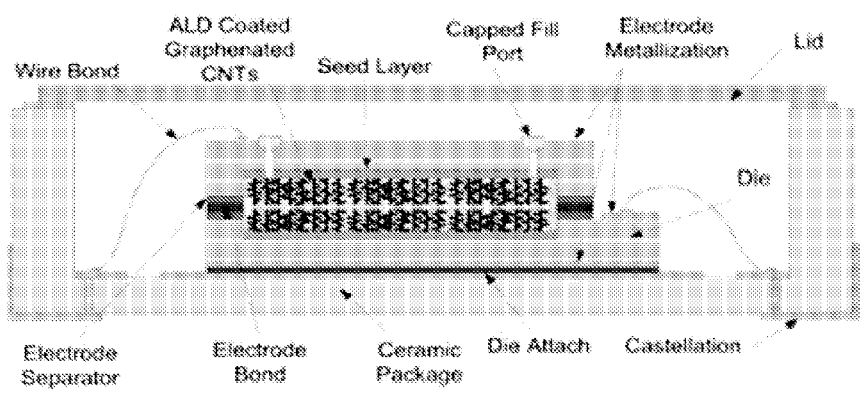
FIG. 23 illustrates an ECDL capacitor mounted in a separate structure, in accordance with some embodiments of the disclosure.

Based on the disclosure for supercapacitors provided herein, the structures developed can be constructed in any manner suitable for application to microelectronics. For example, an ECDL capacitor can be mounted into a mold compound as shown in FIG. 22, where the two electrodes of the capacitor are connected via a wire to a lead on the outside of the mold. Alternatively, the ECDL capacitor can be mounted within a separate structure analogous to a coin-cell structure used previous, as shown in FIG. 23.

The supercapacitors disclosed herein have then achieved gravimetric energy densities of over 100 Wh/kg. The fabrication of the capacitor in a silicon wafer has been achieved. Graphenated-CNTs and pseudocapacitive coatings can significantly increase energy densities. And microfluidics can be used for the electrolyte fill to complete the system.

The following references cited here are incorporate by reference as if set forth in their entirety:

1. J. M. Boyea, R. E. Camacho, S. P. Turano and W. J. Ready, "Carbon Nanotube-Based Supercapacitors: Technologies and Markets," *Nanotechnology Law and Business*, pp. 585-593, (2007).
2. S. Arapelli, H. Fireman, P. Moloney, P. Nikolaev, L. Yowell, C. D. Higgins, K. Kim, P. A. Kohl, S. P. Turano, and W. J. Ready. "Carbon Nanotube-Based Electrochemical Double-Layer Capacitor Technologies for Spaceflight Applications." *JOM*, Vol. 57, No. 12, pp 26-31, (2005).
3. R. Reit, J. Nguyen and W. J. Ready, "Growth Time Performance Dependence of Vertically Aligned Carbon Nanotube Supercapacitors Grown on Aluminum Substrates." Electrochemica Acta. Vol. 91, pp. 96-100, (2013).
4. Eun Ju Bae, Yo-Sep Min, Donghun Kang, Ju-Hye Ko, and Wanjun Park, "Low-Temperature Growth of Single-Walled Carbon Nanotubes by Plasma Enhanced Chemical Vapor Deposition," Chem. Mater., 2005, 17 (20), pp 5141-5145.
5. San Hua Lim, Zhiqiang Luo, ZeXiang Shen, Jianyi Lin, "Plasma-Assisted Synthesis of Carbon Nanotubes," Nanoscale Res Lett (2010) 5:1377-1386.
6. S. Hofmann, B. Kleinsorge, C. Ducati, A. C. Ferrari, J. Robertson, "Low-temperature plasma enhanced chemical vapour deposition of carbon nanotubes," Appl. Phys. Lett. 83, 135 (2003).
7. Guan Yow Chen, Ben Jensen, Vlad Stolojan, S. R. P. Silva, "Growth of carbon nanotubes at temperatures compatible with integrated circuit technologies," Carbon, Volume 49, Issue 1, January 2011, Pages 280-285.
8. M. S. Haquel, K. B. K. Teo, N. L. Rupensinghe, S. Z. Ali, I. Haneef, Sunglyul Maeng, J. Park, F. Udrea, and W. I. Milne, "On-chip deposition of carbon nanotubes using CMOS microhotplates," Nanotechnology, 19 (2008), 025607 (5 pp).
9. Robert Fisher, Morgan Watt, and Jud Ready, "Functionalized Carbon Nanotube Supercapacitor Electrodes: A Review on Pseudocapacitive Materials" Accepted for publication by Journal of Solid State Science and Technology (2013).
10. N. S. Dhillon, M. W. Chan, J. C. Cheng, A. P. Pisano, "Noninvasive hermetic sealing of degassed liquid inside a microfluidic device based on induction heating," *Power-MEMS*, Conference Proceedings, 2011.
11. Lin, L, Etc. "Planar MEMS Supercapacitor Using Carbon Nanotube Forests." IEEE. IEEE, n.d. Web. 12 Dec. 2013.
12. Heer, Walt A., Etc. "Carbon Nanotubes—the Route Toward Applications." Science Magazine. Science, n.d. Web. 13 Dec. 2013.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

I claim:

1. An electrochemical double-layer capacitor comprising:
   a bottom substrate having a first cavity;
   a first plurality of substantially aligned carbon nanotubes vertically disposed within the first cavity;
   a top substrate having a second cavity facing the first cavity;
   a second plurality of substantially aligned carbon nanotubes vertically disposed within the second cavity;
   a gap between the first plurality of substantially aligned carbon nanotubes and the second plurality of substantially aligned carbon nanotubes, wherein a gap height prevents contact between the first plurality of substantially aligned carbon nanotubes and the second plurality of substantially aligned carbon nanotubes.

2. The electrochemical double-layer capacitor of claim 1, wherein at least a portion of the first and second plurality of carbon nanotubes are functionalized with a non-faradaic material.

3. The electrochemical double-layer capacitor of claim 2, wherein the non-faradaic material comprises graphene platelets.

4. The electrochemical double-layer capacitor of claim 1, wherein at least a portion of the first and second plurality carbon nanotubes are functionalized with a faradaic material.

5. The electrochemical double-layer capacitor of claim 4, wherein the faradaic material is selected from the group consisting of ruthenium oxides, manganese oxides, iron oxide, tin oxides, vanadium oxides, titanium oxides, iridium dioxides, cobalt oxides, nickel oxides, indium oxides, copper oxides, and zinc oxides.

6. The electrochemical double-layer capacitor of claim 4, wherein the faradaic material comprises titanium oxide.

7. The electrochemical double-layer capacitor of claim 4, wherein the faradaic material comprises ruthenium oxide.

8. The electrochemical double-layer capacitor of claim 1, wherein at least a portion of the first and second plurality carbon nanotubes are functionalized with both of a faradaic material and a non-faradaic material.

9. The electrochemical double-layer capacitor of claim 1, wherein the non-faradaic material comprises graphene platelets and the faradaic material comprises at least one of titanium oxide and ruthenium oxide.

10. The electrochemical double-layer capacitor of claim 1, wherein the bottom substrate and the top substrate each comprise an electrode.

11. The electrochemical double-layer capacitor of claim 1, further comprising an electrolyte disposed on at least a portion of the electrochemical double-layer capacitor.

12. The electrochemical double-layer capacitor of claim 11, wherein the electrolyte comprises a ionic liquid.

13. The electrochemical double-layer capacitor of claim 1, further comprising a micropackage located between the bottom substrate and the top substrate, wherein a top end of the micropackage is proximate a bottom end of the top substrate and a bottom end of the micropackage is proximate a top end of the bottom substrate.

14. The electrochemical double-layer capacitor of claim 13, wherein a height of the first plurality of carbon nanotubes does not exceed the bottom end of the micropackage and wherein a height of the second plurality of carbon nanotubes does not exceed the top end of the micropackage.

15. The electrochemical double-layer capacitor of claim 1, wherein the gap height is from about 10 micron to about 50 micron.

16. The electrochemical double-layer capacitor of claim 1, wherein at least a portion of open space between the two sides of the capacitor is not occupied by a separator.

17. The electrochemical double-layer capacitor of claim 1, wherein a gravimetric energy density of the active materials of the unpackaged capacitor is from about 100 Whr/kg to about 1000 Whr/kg.

18. The electrochemical double-layer capacitor of claim 1, further comprising:
 a first electrode of the electrochemical double-layer capacitor comprising the first plurality of substantially aligned carbon nanotubes and
 a second electrode of the electrochemical double-layer capacitor comprising the second plurality of substantially aligned carbon nanotubes.

* * * * *